(12) United States Patent
Hostetler

(10) Patent No.: US 8,962,468 B1
(45) Date of Patent: Feb. 24, 2015

(54) FORMATION OF OHMIC CONTACTS ON WIDE BAND GAP SEMICONDUCTORS

(71) Applicant: John L. Hostetler, Monmouth Junction, NJ (US)

(72) Inventor: John L. Hostetler, Monmouth Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 14/259,363

(22) Filed: Apr. 23, 2014

(51) Int. Cl.
*H01L 21/28* (2006.01)
*H01L 21/04* (2006.01)
*H01L 21/304* (2006.01)

(52) U.S. Cl.
CPC .......... *H01L 21/046* (2013.01); *H01L 21/0485* (2013.01); *H01L 21/304* (2013.01)
USPC ........................................................ 438/602

(58) Field of Classification Search
None
See application file for complete search history.

(56) References Cited

U.S. PATENT DOCUMENTS

| | | | |
|---|---|---|---|
| 7,141,498 B2 | 11/2006 | Malhan et al. | |
| 8,163,630 B2 * | 4/2012 | Nemoto | 438/478 |
| 2005/0020095 A1 * | 1/2005 | Baur et al. | 438/795 |
| 2005/0104072 A1 | 5/2005 | Slater, Jr. et al. | |
| 2007/0200116 A1 | 8/2007 | Harris et al. | |
| 2009/0233418 A1 | 9/2009 | Agarwal et al. | |
| 2011/0151648 A1 * | 6/2011 | Quick | 438/478 |
| 2011/0211249 A1 | 9/2011 | Quick et al. | |
| 2011/0272711 A1 * | 11/2011 | Okano | 257/77 |
| 2012/0068161 A1 | 3/2012 | Lee et al. | |
| 2012/0132927 A1 * | 5/2012 | Seki et al. | 257/77 |
| 2012/0217513 A1 * | 8/2012 | Tega et al. | 257/77 |
| 2013/0040445 A1 | 2/2013 | Kubota et al. | |

* cited by examiner

*Primary Examiner* — Evan Pert
*Assistant Examiner* — Herve Assouman
(74) *Attorney, Agent, or Firm* — Baker & Hostetler LLP

(57) ABSTRACT

Systems and methods for semiconductor wafer processing include irradiating a surface of a semiconductor wafer with a laser beam of sufficient energy to alter a band gap of semiconductor material thereby melting a portion of the wafer to generate a graphitic layer area. A metal layer is then depositing on the surface to create ohmic contacts at the area that where melted by the laser.

20 Claims, 5 Drawing Sheets

US 8,962,468 B1

FORMATION OF OHMIC CONTACTS ON WIDE BAND GAP SEMICONDUCTORS

FIELD OF THE DISCLOSURE

The present disclosure relates to the field of wide band gap semiconductor wafer processing, and the formation of ohmic contacts and the devices made using the same.

BACKGROUND

Electrical contacts formed on wide band gap semiconductor materials that exhibit ohmic behavior and low barrier resistance are typically formed by depositing metallic layers and applying a subsequent high temperature (>800° C.) anneal/diffusion process in a furnace over a period of minutes or longer. The impact of having a high temperature process step that heats all features on the wafer means that ohmic contacts must be made before any temperature sensitive functional surface features are formed, which greatly restricts the order of processes and the design freedom to form devices out of wide band gap semiconductors. The typical metal silicide procedure using a solid-state diffusion furnace has kept silicon carbide devices from mainstream wafer fabrication lines for decades. It is highly desirable to find a process that only heats the area intended for ohmic contact, while not affecting the other temperature sensitive features For wide band gap semiconductor materials, such as silicon carbide and gallium nitride, a metal with a sufficiently low work function does not generally exist to create a low enough barrier to exhibit efficient thermionic-emission contacts. Therefore, field emission tunneling ohmic contacts are sought where the band structure of the silicon carbide very near the surface is altered in such a way that electrons can tunnel through a thin electrical barrier instead of jumping over the barrier as with thermionic-emission contacts. In the traditional case of forming a metal silicide in a solid-state diffusion furnace, silicon atoms diffuse and alloy with the metal atoms. The out-diffused silicon alters the band structure of the silicon carbide material to create an ohmic contact with reported resistivity values of $1 \times 10^{-5}$ Ohm-cm$^2$.

Another method of forming a tunneling ohmic contact to silicon carbide is by highly doping the semiconductor region near the surface, which produces the desirable change in the band gap for tunneling contacts. Substrate doping is typically limited by the boule growth process to ~$5 \times 10^{18}$ cm$^{-3}$ for wide band gap conductive substrates. Thus, achieving a high level of doping, (e.g., >>$5 \times 10^{18}$ cm$^{-3}$), is typically done by ion implantation or by epitaxial growth, both of which require high temperature (>800° C.) furnaces and greatly restrict the order of processes and design freedom to form devices out of wide band gap semiconductors. In addition, both ion implantation and epitaxial growth limit the ability to incorporate dopants to about 2 orders of magnitude below the solubility limit. Finally, the formation of the ohmic contact is completed after the subsequent deposition of metals on the highly doped semiconductor surface.

Another method of forming a tunneling ohmic contact to silicon carbide is by highly doping the semiconductor region near the surface through laser doping. Laser doping is a process where the ambient above the semiconductor surface is controlled in a sealed ampoule and a highly concentrated dopant gas is introduced into the ampoule. A laser pulse is incident through a window in the ampoule and melts the surface of the semiconductor at which time the highly concentrated dopant gas diffuses into the melted surface of the semiconductor and activates upon solidification. Dopant levels near the solubility limit have been reached using laser doping. Ohmic contact resistivities on the order of $1 \times 10^{-5}$ Ohm-cm$^2$ have been reported for silicon carbide once metals are deposited post laser treatment.

It is highly desirable to thin a semiconductor wafer by standard grinding and polishing processes to reduce the electrical resistance created by the substrate that is limited in electrical conductivity due to the limited doping levels available in boule growth processes. However, the ability to accurately form topside features through photolithographic processes, material depositioned, and etching is greatly inhibited when the wafer is thinned to the point of excessive fragility and warpage. Attaching thinned semiconductor wafers to wafer carriers is a typical approach to counteract excessive warpage and allow critical topside processes to be accurately completed, but this approach requires additional process steps and challenges. Therefore, it is desired to perform the wafer thinning process after or nearly after all topside features are completed so that the use of a wafer carrier is not required. Furthermore, it is desired that after wafer thinning there are no high temperature processes utilized that compromise the thinned wafer's structural integrity or the functional features already formed. In addition, it is desired that high volume semiconductor production have an ohmic contact process that does not require the use of sealed, pressurized ampoules.

SUMMARY

In an embodiment, low resistance ohmic contacts may be formed to wide band gap semiconductors, in particular silicon carbide (e.g., 4H-silicon carbide, 6H-silicon carbide, and 3C-silicon carbide), using laser pulses. The ohmic contact formation may be performed at any step during the processing of a semiconductor wafer, including after the completion of all topside features and/or after wafer thinning. An exemplary process relies on the laser beam's direct interaction with the silicon carbide semiconductor crystal and, in an embodiment, may be performed without any preprocessing of the semiconductor surface before laser irradiation to which the ohmic contact is made. In addition, the process does not require formation of metal silicides or the use of a wafer carrier.

In the formation of many semiconductor devices, and especially power electronics, one side (e.g., the topside) of a semiconductor substrate may processed to form the primary function of a device, and the other side (e.g., the backside) may be utilized as an electrical terminal. The vertical geometry may allow the backside to be bonded to a heat sink and serve as a thermal conduction path for cooling and thus may be useful for devices generating significant amounts of heat. In some forms, the topside processing may involve epitaxial growth, etching of patterned features in the substrate and/or epitaxial layers, patterned ion implantation, patterned dielectric deposition, and/or patterned metal deposition. For such vertical devices, it may be advantageous to have the substrate as thin as possible to minimize the electrical resistance and reduce the thermal impedance. The thinning process may involve grinding and polishing and may be performed after the topside processing is complete or nearly complete. Once the backside is thinned, the backside substrate surface may be treated to aid in the creation of an ohmic contact with low electrical resistance.

In some embodiments, the treatment of the substrate surface for ohmic contact may be performed by a laser. In one such embodiment, the substrate surface may be left untouched after grinding and polishing leaving a bare silicon carbide surface. The semiconductor surface may be irradiated with a pulsed laser where the laser wavelength and pulse width are selected such that the semiconductor surface experiences a melt. The wavelength may also be selected such that it melts one surface, but with insufficient energy absorbed at the opposite surface as to not influence the second surface or features on that surface. An inert gas jet may be positioned to flood the laser irradiated surface to minimize surface exposure from ambient oxygen.

Upon incidence of the laser pulse, the bare silicon carbide surface may heat up and induce silicon desorption from the silicon carbide into the ambient because the silicon sublimation temperature occurs at a lower temperature than that of carbon when irradiating with a photon energy below the silicon carbide band gap. Further heating induces melting of the semiconductor surface. Upon solidification after the laser pulse, a polycrystalline carbon rich graphitic layer may be created that has narrow band gap properties to produce efficient ohmic contacts after subsequent metals are deposited post laser processing. If the laser wavelength, pulse duration, and incident fluence are sufficient, the thin laser induced graphitic layer can create ohmic contacts with resistivity values of $1\times10^{-5}$ Ohm-cm$^2$.

The completion of the ohmic contact formation may be performed by depositing metals for electrical contact and die attach using typical industry processes. The metal layers may include an adhesion layer, such as Ti, followed by a diffusion barrier, such as W, TiW, Pt, or Ni, and subsequently followed by an overlay of Au, Ag or Cu.

In an embodiment, an optically thin metal film is deposited on the bare semiconductor surface to control the reflectivity of the ground and polished substrate that can experience damage and roughness from the thinning process creating process variability. The optically thin metal film thickness should be sufficiently less than the penetration depth of the laser light in the metal so that enough laser energy can be deposited into the silicon carbide surface below to achieve melting of the silicon carbide and formation of the carbon rich graphitic layer.

In an embodiment, the bare silicon carbide semiconductor surface can be ion-implanted with dopant atoms after thinning. Laser heating may then cause melting of the silicon carbide material, dopant activation, and the creation of the graphitic layer on the ion-implanted silicon carbide surface.

In an embodiment, the bare silicon carbide semiconductor surface that has undergone ion-implantation with dopant atoms after thinning experiences a two-step laser process, where the irradiation is a pulse, or pulses, of insufficient fluence to melt the silicon carbide surface, but sufficient to anneal out the damage from the ion-implantation, followed by the irradiation of a pulses or pulses with sufficient fluence to melt the silicon carbide surface and create the carbon rich graphitic layer on the ion-implanted surface.

DETAILED DESCRIPTION

Figure 1A:
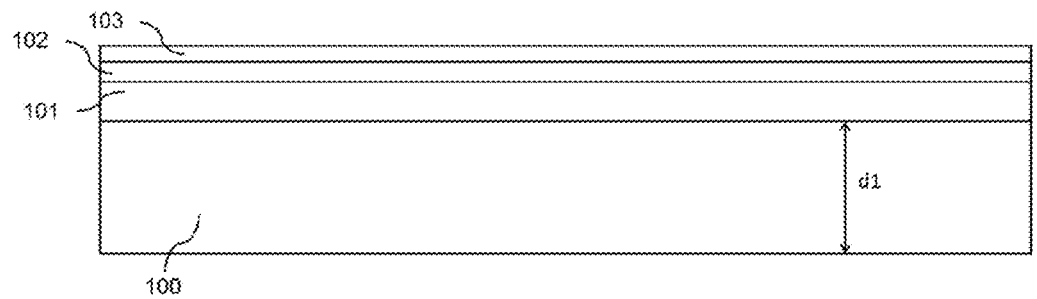
FIG. 1A is a diagram of an exemplary wide band gap semiconductor wafer comprised of a substrate and a multitude of planar layers.

The present disclosure may be understood more readily by reference to the following detailed description taken in connection with the accompanying figures and examples that form a part of this disclosure. It is to be understood that this disclosure is not limited to the specific devices, methods, applications, conditions, or parameters described and/or shown herein, and that the terminology used herein is for the purpose of describing particular embodiments by way of example only and is not intended to be limiting of the claimed embodiments. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the disclosure that are, for clarity, described herein in the context of separate embodiments may also be provided in combination in a single embodiment. Conversely, various features of the disclosure that are, for brevity, described in the context of a single embodiment may also be provided separately or in any subcombination. Furthermore, references to values stated in ranges include each and every value within that range. As shown and described herein, common reference numbers used to describe or label features of the various embodiment are intended to denote the same or similar features.

When forming semiconductor devices out of semiconducting or semi-insulating substrates, there are two classes of devices, lateral and vertical. A lateral device is typically formed where all of the electrical contacts to the device lie on one side (e.g., the topside) of a wafer and all of the device functions and current flow occur across that one side in a lateral manner. In contrast, a vertical device, the current flows vertically through the substrate, and the one side (e.g., the backside) of the substrate acts as an electrical contact which can be attached to a heat sink for cooling. Typically, lateral devices are fabricated on semi-insulating substrates, while vertical devices are fabricated on semiconducting substrates. The embodiments described herein apply to both classes of devices, but are particularly beneficial to vertical devices, especially devices that generate a lot heat as in the case with power electronics, where high voltages and high currents are present. In the case of a vertical device on a semiconducting substrate, if the substrate is thick enough it may have two deleterious effects. One effect is that when the current passes through the substrate, it acts as a resistive loss and generates unwanted heat. The second effect is that, for most devices, the primary heat generation occurs in the layers near the topside and this heat must be conducted out through the substrate. In such embodiments, the thicker the substrate, the longer the heat conduction path and the higher device temperature. Both effects are undesirable, therefore it is advantageous to grind the substrate to the thinnest value possible without affecting the wafer yield or device performance. In the disclosed embodiments, a method of forming ohmic contacts to silicon carbide semiconductor surfaces after the substrate has been thinned may be used and is described in more detail below. In the disclosed embodiments, the substrate may be constructed of or include silicon carbide, such as 4H-silicon carbide, 6H-silicon carbide, or 3C-silicon carbide.

Figure 1B:
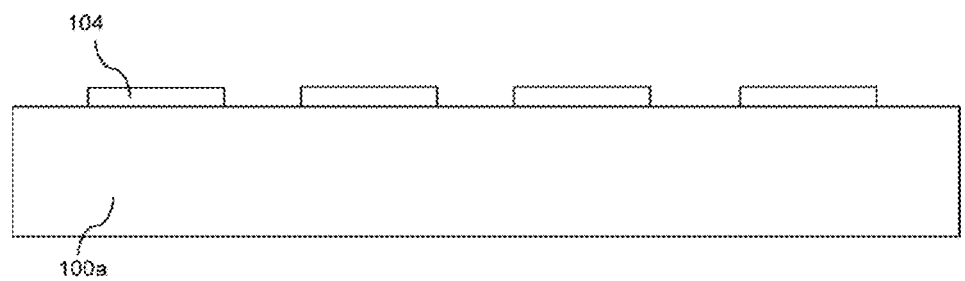
FIG. 1B is a diagram of an exemplary wafer with completed electronic devices on a wafer topside.

FIG. 1A shows an exemplary wafer comprising a multitude of planar layers where 100 is a semiconductor substrate of conductivity type 1 and initial thickness d1, which may lie in the range of 350-500 μm. Layers 101, 102, 103 represent a multitude of layers created by any number of typical semiconductor industry processes for the creation of an electronic device. The multitude of layers is not limited to four, and may encompass any number of layers needed to form electronic devices. Some examples of additive processes are, but are not limited to, epitaxial growth, ion-implantation, dielectric film growth or deposition, and metal or semi-metal deposition. In addition, subtractive processes, such as etching, grinding, ion milling, and general material removal along with subsequent patterning and overlap between layers may be used in some embodiments to form electronic devices. FIG. 1B depicts a completed semiconductor device 104 where all topside process have been performed to create a plurality of vertical electronic devices on substrate 100. The devices 104 may later be separated by sawing, scribing and breaking, or laser cutting though the substrate 100 into individual devices. Such electronics devices may include, but are not limited to, Junction Field Effect Transistors (JFETs), Metal Oxide Field Effect Transistors (MOSFETs), Junction Barrier Diodes (JBSs), Insulated Gate Bipolar Transistors (IGBTs), Gate Turn-off Thyristors (GTO's), Bipolar Junction Transistors (BJTs), PiN diodes, and Merged PiN Schottky diodes (MPSs).

Figure 1C:
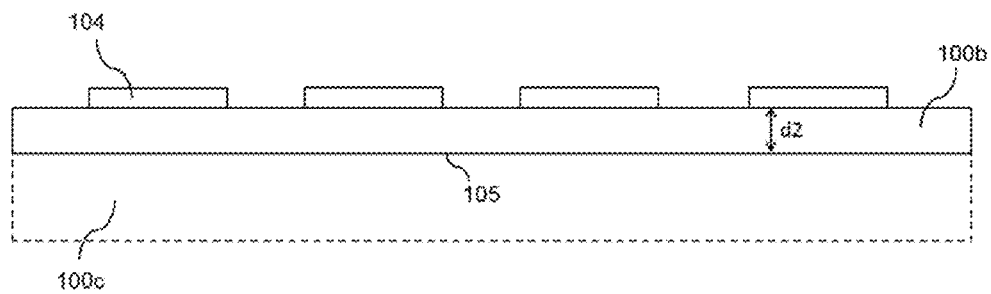
FIG. 1C is a diagram of an exemplary wafer with a backside thinned after completion of topside features.

The substrate thinning process follows the device 104 processing and is depicted in FIG. 1C. Substrate thinning may include thinning the substrate backside 105 by grinding and/or polishing to remove material 100*c* so that the final substrate thickness is distance d2. The thinned substrate 100*b* thickness d2 may be between 50 μm and 150 μm, but may be any distance less than d1.

Figure 2A:
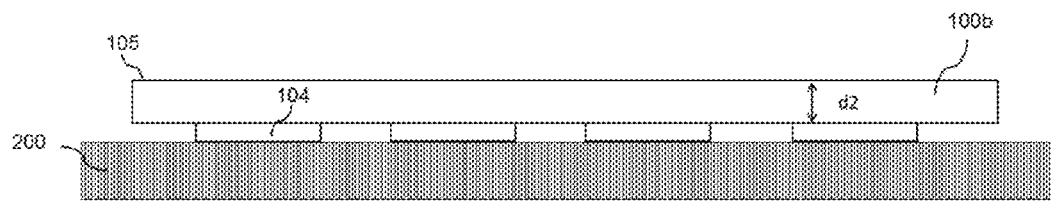
FIG. 2A is a diagram of an exemplary wafer with completed electronic devices mounted on a vacuum chuck.
Figure 2B:
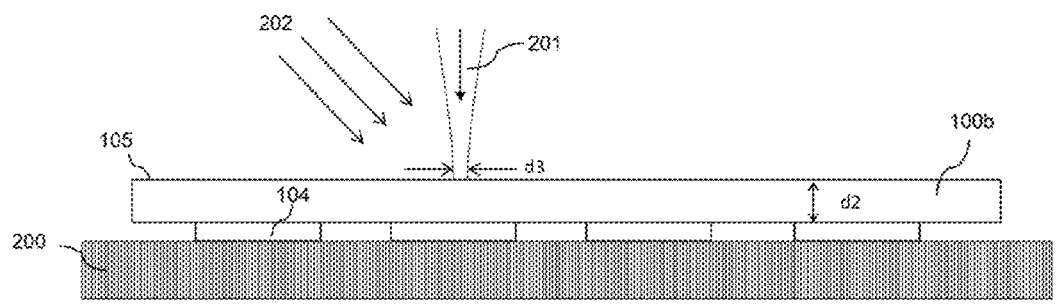
FIG. 2B is a diagram of an exemplary wafer with a laser beam incident on a wafer backside and inert gas stream over an irradiated area.
Figure 2C:
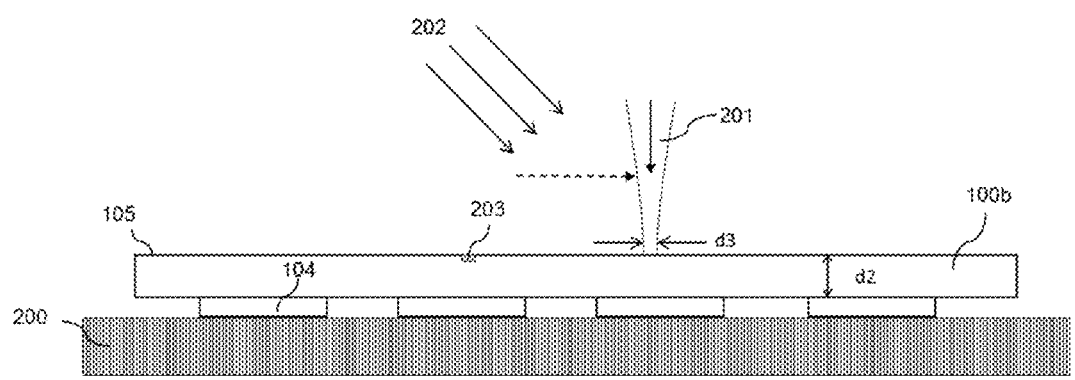
FIG. 2C is a diagram of an exemplary formation of a carbon rich graphitic layer after irradiation of laser pulse(s) and motion of a laser beam to new location.

Referring now to FIG. 2A, where the wafer has been turned over relative to the view show in FIGS. 1A-1C, after the thinning process, the wafer may be placed on a vacuum chuck 200 with the processed devices 104 coincident with the vacuum chuck surface, leaving the exposed wafer backside surface 105 facing up. The vacuum chuck may provide enough vacuum across the wafer to flatten the wafer sufficiently for uniform irradiation of a laser beam. Referring to FIG. 2B, an inert gas stream 202, such as nitrogen, argon, or helium, may be incident at the wafer where the laser irradiation is present. The wafer need not be in a sealed ampoule or chamber, but sufficient inert gas may be present to reduce the chance of oxidation of the irradiated region. The exposed (i.e., not covered with any layers or other material) back surface of the substrate 105 may then be irradiated locally with a focused laser beam 201 of circular cross section with diameter d3 as seen in FIG. 2B. The laser beam may be comprised of a pulse, or a plurality of pulses, of sufficient wavelength, pulse duration, and fluence to heat and melt the silicon carbide material. In an embodiment, the process of laser heating and melting creates a thin layer on surface 105 containing a graphitic layer 203, referring now to FIG. 2C, defined by the area of the incident laser beam with the desirable band structure to aid in the formation of ohmic contacts after subsequent overlay metals are deposited. Once the graphitic layer is formed at the current laser beam position, the beam is moved to the next location and the process repeated until the final desired area or pattern has been irradiated as seen in FIG. 2C.

Figure 2D:
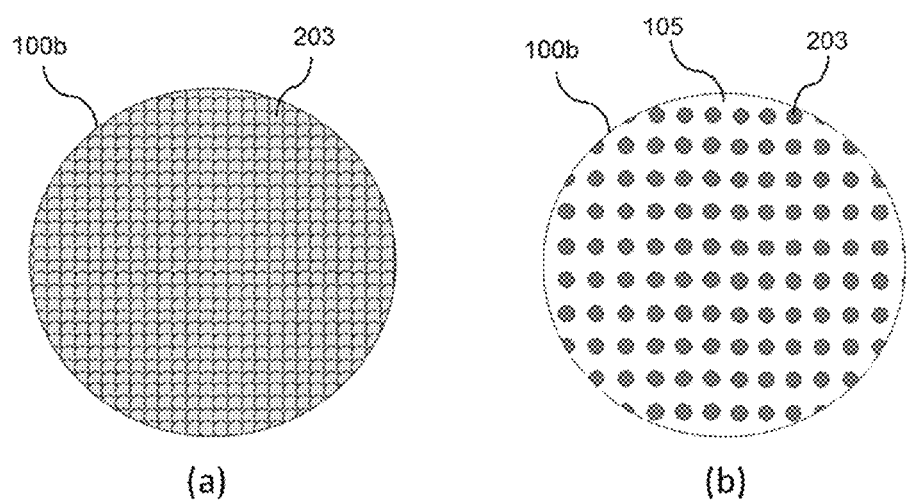
FIG. 2D is a top view of an exemplary wafer surface showing possible patterns that are laser irradiation and graphitic layer formations.

The circular graphitic layer shape defined by laser irradiation may be patterned to cover the entire wafer backside 105 with overlapping regions as seen in FIG. 2D(a), which is a top view of 100*b*, or as a pattern of circular areas separated by any distance as seen in FIG. 2D(b). Any pattern may be formed using the area defined by the laser beam cross-section at surface 105 through stepping and repeating where motion of the laser beam or vacuum stage is used, and all such embodiments are contemplated as within the scope of the present disclosure.

In an embodiment, where the substrate is constructed of 4H-silicon carbide, the laser pulse, or plurality of pulses, used to form the graphitic layer may be of wavelengths ranging from 315 nm to 400 nm, with a temporal pulse width ranging from 50 to 200 ns. An incident fluence range of 5-10 $J/cm^2$ may be sufficient to form the desired graphitic layer to form ohmic contacts. Any other combinations of wavelengths, pulse widths, and fluence ranges are contemplated as within the scope of the present disclosure.

Figure 2E:
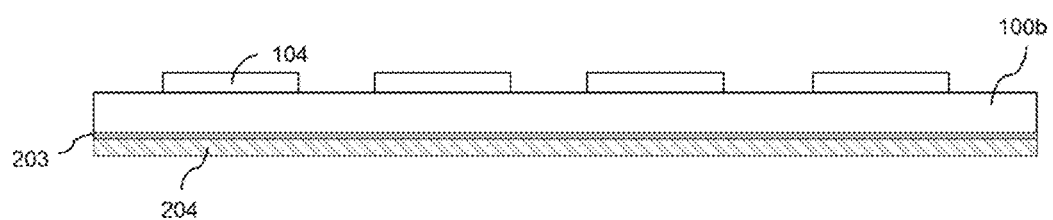
FIG. 2E is a diagram of an exemplary wafer with backside metals deposited to complete the formation of the ohmic contact.

Referring now to FIG. 2E, the completion of the ohmic contact formation may be performed by a subsequent deposition of a multi-layer metal stack 204 for electrical contact and die attachment using industry standard practices. Ohmic metal overlays may comprise the deposition of an adhesion layer, such as titanium, followed by a diffusion barrier, such as tungsten, platinum, or nickel, and may be subsequently followed by an overlay of gold, silver or copper.

Figure 3A:
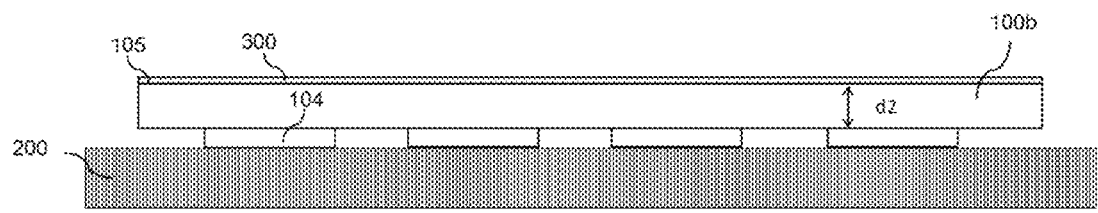
FIG. 3A is a diagram of an exemplary wafer with completed electronic devices mounted on a vacuum chuck showing a back surface deposited with an optically thin metal layer.
Figure 3B:
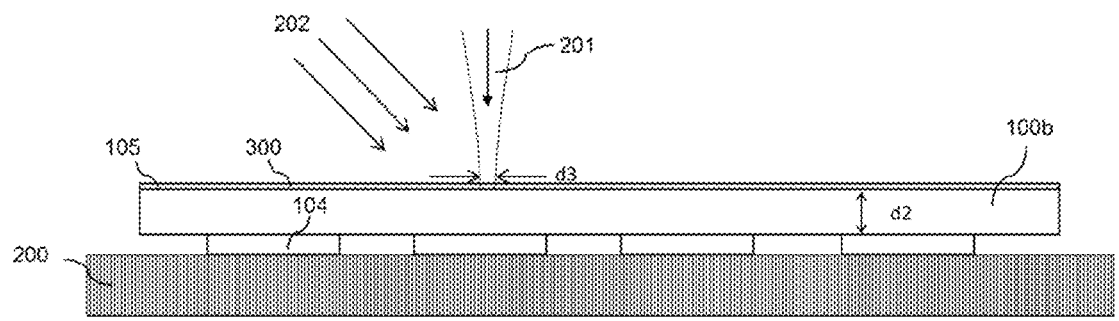
FIG. 3B is a diagram of an exemplary wafer with a laser beam incident on a wafer backside with an optically thin metal layer and an inert gas stream over an irradiated area.
Figure 3C:
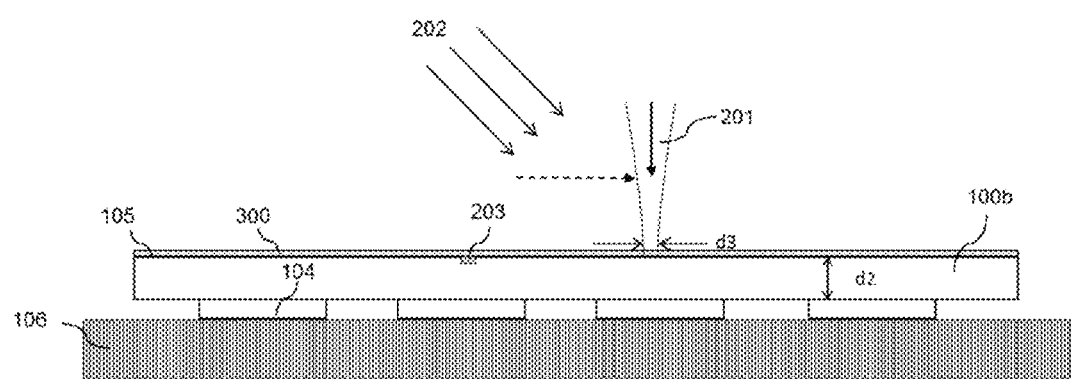
FIG. 3C is a diagram of an exemplary wafer showing formation of a carbon-rich graphitic layer underneath an optically thin metal layer after an irradiation of laser pulse(s) and motion of a laser beam to a new location.

In one embodiment of this invention, an optically thin metal film 106 may deposited on the bare semiconductor surface 105 before irradiation of a laser beam as seen in FIG. 3A. In one embodiment, the bare silicon carbide surface is left after only grinding with a coarse grit grinding wheel without further polishing with a finer grit. The grinding of the silicon carbide surface induces damage to the crystalline semiconductor structure and alters the absorption of the laser light, and thus the onset of melting when irradiated with a laser pulse. The rough grinding process may create variability in the absorption across the substrate surface as well as from wafer-to-wafer. Referring now to FIG. 3B, to control the absorption of the laser pulse in such an embodiment, an optically thin metal film 300 may be deposited to a thickness less than the penetration depth of the laser light in the metal, so that enough laser energy may be deposited into the silicon carbide surface to achieve melting of the silicon carbide and formation of the graphitic layer 203 on surface 105 as seen in FIG. 3C. For the case of 4H-silicon carbide, a laser light of wavelength about 315 nm to 400 nm, and metal films consisting of any of aluminum, titanium, nickel, tantalum, tungsten, or palladium, the thickness of the metal film may be less than 100 nm. After irradiation of a laser pulse, or a plurality of laser pulses, any remaining material from the optically thin metal may be removed by a standard wet or plasma etching process, exposing the graphitic layer before subsequent backside metallization for the formation of the ohmic contact.

Figure 4A:
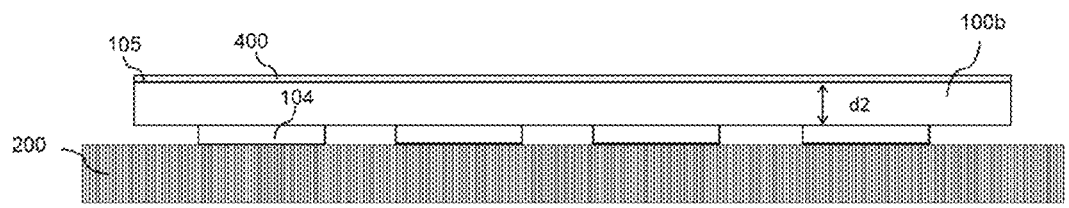
FIG. 4A is a diagram of an exemplary wafer with completed electronic devices mounted on a vacuum chuck showing a back surface with an ion-implanted region.
Figure 4B:
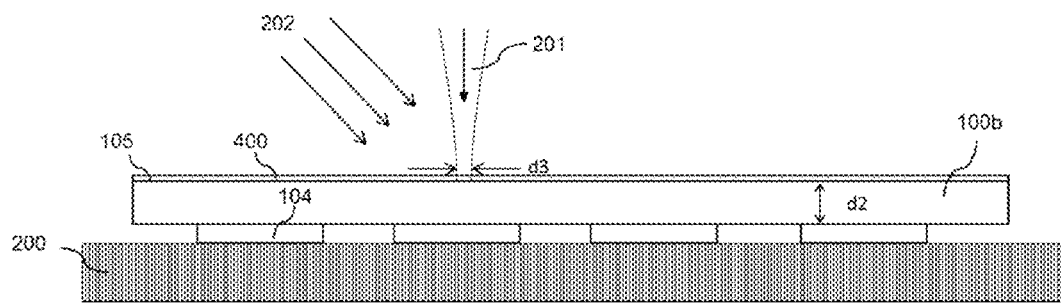
FIG. 4B is a diagram of an exemplary wafer with a laser beam incident on a wafer backside with an ion-implanted region and an inert gas stream over irradiated area.
Figure 4C:
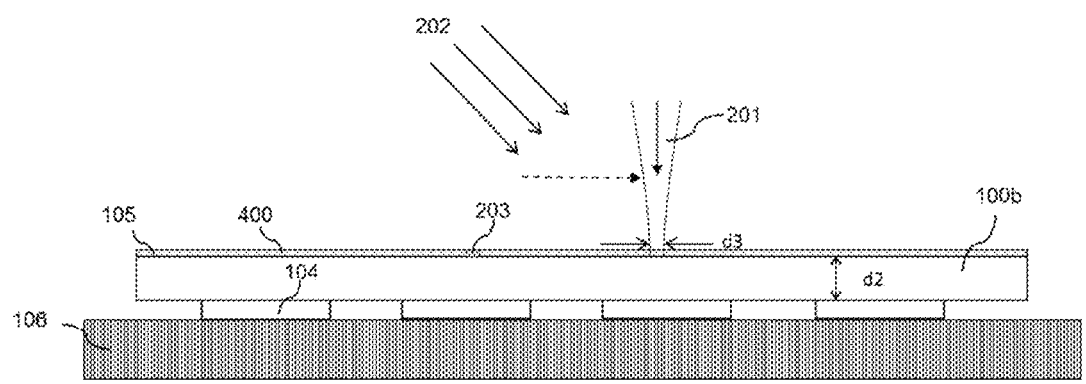
FIG. 4C is a diagram of an exemplary wafer showing formation of a carbon rich graphitic layer in an ion-implanted region after irradiation of laser pulse(s) and motion of a laser beam to new location.

In an embodiment, the bare silicon carbide semiconductor surface 105 may be ion-implanted with dopant atoms after grinding and thinning as seen in FIG. 4A, which creates a layer 400 of damaged semiconductor and an excess of interstitial dopant atoms. Upon subsequent irradiation of surface 400 with a laser pulse, or a plurality of laser pulses, referring now to FIG. 4B, of sufficient wavelength, pulse duration, and fluence to melt the silicon carbide material and cause simultaneous dopant activation. Referring now to FIG. 4C, the result is the creation of the carbon rich graphitic layer on the ion-implanted surface. Where the substrate is 4H-silicon carbide, ion implantation of nitrogen or phosphorous for n-type material, or aluminum or boron for p-type material, may be implanted where typical ion energies ranging from 40 to 150 keV and doses of 1E14 to 5E16 ions/cm$^2$ can be used. In this embodiment, for the case of substrate of 4H-silicon carbide, the laser used to form the graphitic layer may be of wavelength ranging from 315 nm to 400 nm, with a temporal pulse width ranging from 50 to 200 ns. An incident fluence range of 5-10 J/cm$^2$ may sufficient to form the desired graphitic layer in layer 400 to form ohmic contacts. Any other combinations of wavelengths, pulse widths, and fluence ranges are contemplated as within the scope of the present disclosure.

In one embodiment, the bare silicon carbide semiconductor surface may undergo an ion-implantation, or a plurality of ion implantations, after wafer thinning. The implanted surface may be subsequently irradiated with a two-step laser process where the first irradiation is a pulse, or pulses, of insufficient fluence to melt the silicon carbide surface, but sufficient fluence to repair the crystal damage from the ion-implantation and grinding. In the second step, the surface is subsequently irradiated with a laser pulse, or pulses, with sufficient fluence to melt the silicon carbide surface and create the carbon rich graphitic layer on the ion-implanted surface. For the case of a 4H-silicon carbide substrate, ion implantation of nitrogen or phosphorous for n-type material, or aluminum or boron for p-type material can be implanted where typical ion energies ranging from 40 to 150 keV, and doses of 1E14 to 5E16 ions/cm$^2$ can be used. In this embodiment, for the case of 4H-silicon carbide, the laser used to form the graphitic layer can be of wavelength ranging from 315 to 400 nm, with a temporal pulse width ranging from 50 to 200 ns. An incident fluence range of 1-5 J/cm$^2$ is sufficient to repair the damaged crystal without melting. The subsequent melting step of the silicon carbide surface typically uses a laser fluence range of 5-10 J/cm$^2$ in a sufficient manner to form the desired graphitic layer for ohmic contacts. Any other combinations of wavelengths, pulse widths, and fluence ranges are contemplated as within the scope of the present disclosure.

In one embodiment, the bare silicon carbide semiconductor surface may undergo an ion-implantation, or a plurality of ion implantations, after wafer thinning. The implanted surface may subsequently be irradiated with a three-step laser process where the first irradiation is a pulse, or pulses, of insufficient fluence to melt the silicon carbide surface, but sufficient fluence to repair the crystal damage from the ion-implantation and grinding. In the second step, the surface is subsequently irradiated with a laser pulse, or pulses, with sufficient fluence to melt the silicon carbide surface and create the carbon rich graphitic layer on the ion-implanted surface. In this embodiment, the laser-treated ion-implanted surfaces are followed by the deposition of an optically thin metal layer to a thickness less than the penetration depth of the laser light in the metal. The metalized layer then undergoes a third laser irradiation so that enough laser energy may be deposited into the silicon carbide surface to achieve melting of the silicon carbide and further formation of the graphitic layer. In this embodiment, ohmic contacts with resistivity values of $5 \times 10^{-6}$ Ohm-cm$^2$ may be achieved. For the case of 4H-silicon carbide, ion implantation of nitrogen or phosphorous for n-type material, or aluminum or boron for p-type material, may be implanted where typical ion energies ranging from 40 to 150 keV, and doses of 1E14 to 5E16 ions/cm$^2$ can be used. In this embodiment, for the case of 4H-silicon carbide, the laser used to form the graphitic layer may be of wavelength ranging from 315 nm to 400 nm, with a temporal pulse width ranging from 50 ns to 200 ns. An incident fluence range of 1-5 J/cm$^2$ is sufficient to repair the damaged crystal without melting. The subsequent melting step of the silicon carbide surface typically uses a laser fluence range of 5-10 J/cm$^2$ a in a sufficient manner to form the desired graphitic layer for ohmic contacts. In the case of the third laser treatment, after the optically thin metal film is deposited on the laser treated ion-implanted surface, typical fluence range of 3-7 J/cm$^2$ in a sufficient manner to form the desired graphitic layer for ohmic contacts achieving resistivity of $5 \times 10^{-6}$ Ohm-cm$^2$. Any other combinations of wavelengths, pulse widths, and fluence ranges are contemplated as within the scope of the present disclosure.

In an embodiment, the bare silicon carbide semiconductor surface may undergo an ion-implantation, or a plurality of ion implantations, after wafer thinning. The implanted surface is subsequently irradiated with a two-step laser process where the first irradiation is a pulse, or pulses, of insufficient fluence to melt the silicon carbide surface, but sufficient fluence to repair the crystal damage from the ion-implantation and grinding. In this embodiment, the laser treated ion implanted surfaces are followed by the deposition of an optically thin metal layer to a thickness less than the penetration depth of the laser light in the metal. The metalized layer may then undergo the second laser irradiation so that enough laser energy can be deposited into the silicon carbide surface to achieve melting of the silicon carbide and further formation of the graphitic layer. In this embodiment, ohmic contacts with resistivity values of $5 \times 10^{-6}$ Ohm-cm$^2$ can be achieved. For the case of 4H-silicon carbide, ion implantation of nitrogen or phosphorous for n-type material, or aluminum or boron p-type material may be implanted where typical ion energies ranging from 40 to 150 keV, and doses of 1E14 to 5E16 ions/cm$^2$ can be used. In this embodiment, for the case of 4H-silicon carbide, the laser used to form the graphitic layer can be of wavelength ranging from 315 nm to 400 nm, with a temporal pulse width ranging from 50 ns to 200 ns. An incident fluence range of 1-5 J/cm$^2$ is sufficient to repair the damaged crystal without melting. In the case of the second laser treatment, after the optically thin metal film is deposited on the laser treated ion-implanted surface, typical fluence range of 3-7 J/cm$^2$ in a sufficient manner to form the desired graphitic layer for ohmic contacts achieving resistivity of 5×10$^{-6}$ Ohm-cm$^2$. Any other combinations of wavelengths, pulse widths, and fluence ranges are contemplated as within the scope of the present disclosure.

What is claimed is:

1. A method comprising:
   irradiating a bottom surface of a substrate of a semiconductor wafer with a laser beam,
   wherein the substrate is constructed of a wide band gap material comprising silicon carbide,
   wherein the bottom surface of the substrate is exposed,
   wherein the semiconductor wafer comprises the substrate and at least one layer configured on a top surface of the substrate, and
   wherein the laser beam is of sufficient energy to alter a band gap of the wide band gap material to generate a graphitic layer area on the bottom surface of the substrate; and
   depositing a metal layer on the bottom surface of the substrate to form an ohmic contact at the graphitic layer area.

2. The method of claim 1, further comprising, before irradiating the bottom surface of the substrate, grinding the bottom surface of the substrate to thin the substrate.

3. The method of claim 1, wherein the substrate material is 4H-silicon carbide.

4. The method of claim 1, wherein irradiating the bottom surface of the substrate comprises:
   before irradiating the bottom surface of the substrate, depositing an optically thin metal film on the bottom surface of the substrate; and
   irradiating the bottom surface of the substrate with the laser beam.

5. The method of claim 4, wherein the optically thin metal film is deposited to a thickness less than a penetration depth of the laser beam in the optically thin metal film.

6. The method of claim 4, wherein the optically thin metal film is one of an aluminum metal film, a titanium metal film, a nickel metal film, a tantalum metal film, a tungsten metal film, or a palladium metal film.

7. The method of claim 4, wherein the thickness of the optically thin metal film is less than 100 nm.

8. The method of claim 4, further comprising, after irradiating the bottom surface of the substrate and before depositing a metal layer on the bottom surface of the substrate, removing remaining optically thin metal film from the bottom surface of the substrate.

9. The method of claim 1, wherein the laser beam has a wavelength of 315 nm to 400 nm.

10. The method of claim 1, wherein the laser beam has a photon energy below the band gap of the wide band gap material.

11. The method of claim 1, further comprising:
    before irradiating the bottom surface of the substrate with the laser beam, grinding the bottom surface of the substrate to thin the substrate; and
    after grinding the bottom surface of the substrate and before irradiating the bottom surface of the substrate with the laser beam, ion-implanting the bottom surface of the substrate with dopant atoms.

12. The method of claim 11, wherein the laser beam comprises a wavelength, a pulse duration, and a fluence sufficient to melt the wide band gap material and cause simultaneous activation of the dopant atoms.

13. The method of claim 1, wherein, before irradiating the bottom surface of the substrate with the laser beam, irradiating the bottom surface of the substrate with a second laser beam of insufficient energy to alter the band gap of the wide band gap material, wherein the second laser beam is of sufficient energy to repair crystal damage of the wide band gap material.

14. The method of claim 13, further comprising:
    after irradiating the bottom surface of the substrate with the laser beam of sufficient energy to alter the band gap of the wide band gap material to generate the graphitic layer area on the bottom surface of the substrate, depositing an optically thin metal film on the bottom surface of the substrate; and
    irradiating the bottom surface of the substrate with a third laser beam of sufficient energy to alter the band gap of the wide band gap material to generate the graphitic layer area on the bottom surface of the substrate.

15. The method of claim 14, wherein the laser beam of sufficient energy to alter the band gap of the wide band gap material has an incident fluence range of 1 J/cm$^2$ to 5 J/cm$^2$, and wherein the third laser beam of sufficient energy to alter the band gap of the wide band gap material has an incident fluence range of 5 J/cm$^2$ to 10 J/cm$^2$.

16. The method of claim 13, further comprising:
    after irradiating the bottom surface of the substrate with the second laser beam of insufficient energy to alter the band gap of the wide band gap material, depositing an optically thin metal film on the bottom surface of the substrate; and
    irradiating the bottom surface of the substrate with the laser beam of sufficient energy to alter the band gap of the wide band gap material to generate the graphitic layer area on the bottom surface of the substrate.

17. The method of claim 1, wherein irradiating the bottom surface of the substrate comprises irradiating the bottom surface of the substrate with the laser beam using a plurality of laser pulses.

18. The method of claim 17, wherein each of the plurality of laser pulses has a temporal pulse width from 50 ns to 200 ns.

19. The method of claim 1, wherein the substrate material is 6H-silicon carbide.

20. The method of claim 1, wherein the substrate material is 3C-silicon carbide.

* * * * *